(12) United States Patent
Huang et al.

(10) Patent No.: US 7,987,589 B2
(45) Date of Patent: Aug. 2, 2011

(54) MULTILAYER THREE-DIMENSIONAL CIRCUIT STRUCTURE AND MANUFACTURING METHOD THEREOF

(75) Inventors: Han-Pei Huang, Taoyuan County (TW); Cheng-Hung Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 12/333,014

(22) Filed: Dec. 11, 2008

(65) Prior Publication Data

US 2010/0089627 A1 Apr. 15, 2010

(30) Foreign Application Priority Data

Oct. 13, 2008 (TW) ............................... 97139189 A (51) Int. Cl.
*H05K 3/02* (2006.01)
(52) U.S. Cl. ................. 29/846; 29/830; 29/831; 29/852; 174/761
(58) Field of Classification Search .................... 29/842; 174/761
See application file for complete search history.

(56) References Cited

U.S. PATENT DOCUMENTS

| | | | | |
|---|---|---|---|---|
| 5,090,122 A | * | 2/1992 | Kitagawa | 29/852 |
| 5,989,993 A | * | 11/1999 | Zakel et al. | 438/614 |
| 6,032,357 A | * | 3/2000 | Wojewnik | 29/846 |
| 6,495,769 B1 | * | 12/2002 | Saito et al. | 174/255 |
| 6,833,511 B2 | * | 12/2004 | Uchinono et al. | 174/255 |
| 2004/0112634 A1 | * | 6/2004 | Tanaka et al. | 174/262 |
| 2005/0284655 A1 | * | 12/2005 | Hsu et al. | 174/255 |
| 2007/0247822 A1 | | 10/2007 | Naundorf | |
| 2009/0017309 A1 | * | 1/2009 | Lee et al. | 428/418 |

FOREIGN PATENT DOCUMENTS

| | | |
|---|---|---|
| EP | I209959 | 5/2002 |
| TW | I236328 | 7/2005 |
| TW | I238098 | 8/2005 |
| TW | M280052 | 11/2005 |
| TW | I252720 | 4/2006 |
| TW | I265514 | 11/2006 |
| TW | I268130 | 12/2006 |
| TW | M304834 | 1/2007 |
| TW | 200738085 | 10/2007 |
| TW | 200746953 | 12/2007 |

* cited by examiner

*Primary Examiner* — Tuan T Dinh
*Assistant Examiner* — Steven Sawyer
(74) *Attorney, Agent, or Firm* — J.C. Patents (57) ABSTRACT

A multilayer three-dimensional circuit structure and a manufacturing method thereof are provided in the present invention. The manufacturing method includes following steps. First, a three-dimensional insulating structure is provided. A first three-dimensional circuit structure is then formed on a surface of the three-dimensional insulating structure. Next, an insulating layer covering the first three-dimensional circuit structure is formed. Thereafter, a second three-dimensional circuit structure is formed on the insulating layer. Subsequently, at least a conductive via penetrating the insulating layer is formed for electrically connecting the second three-dimensional circuit structure and the first three-dimensional circuit structure.

19 Claims, 6 Drawing Sheets

FIG. 5D

MULTILAYER THREE-DIMENSIONAL CIRCUIT STRUCTURE AND MANUFACTURING METHOD THEREOF

CROSS-REFERENCE TO RELATED APPLICATION

This application claims the priority benefit of Taiwan application serial no. 97139189, filed on Oct. 13, 2008. The entirety of the above-mentioned patent application is hereby incorporated by reference herein and made a part of specification.

BACKGROUND OF THE INVENTION

1. Field of the Invention

The present invention relates to a three-dimensional circuit structure and a manufacturing method thereof. More particularly, the present invention relates to a multilayer three-dimensional circuit structure and a manufacturing method thereof.

2. Description of Related Art

In recent years, with rapid progress of electronic technologies and advancement of high-tech electronic industry, human-oriented electronic products with superior performance have brought forth a new era and have been designed to cater to the trend of being light, thin, short, and small. Generally, according to the pertinent art, a circuit board for hosting and electrically connecting a plurality of electronic devices is disposed in a casing for protecting the circuit board and the electronic devices. Nonetheless, since shapes of the electronic devices are limited to be in conformity with a shape and a dimension of the circuit board, most of the electronic devices are two-dimensional rather than three-dimensional.

In order to directly form signal traces on the circuit board having a three-dimensional structure in replacement of the conventional circuit board, a molded interconnect device (MID) equipped with both electronic and mechanical functions in a three-dimensional structure was proposed, such that printed circuit boards are no longer required to be planar. By conducting the concept of MID, a three-dimensional circuit structure can be formed on a surface of a three-dimensional structure, so as to increase usable space within the casing and miniaturizing the electronic devices to a better degree.

Figure 1:
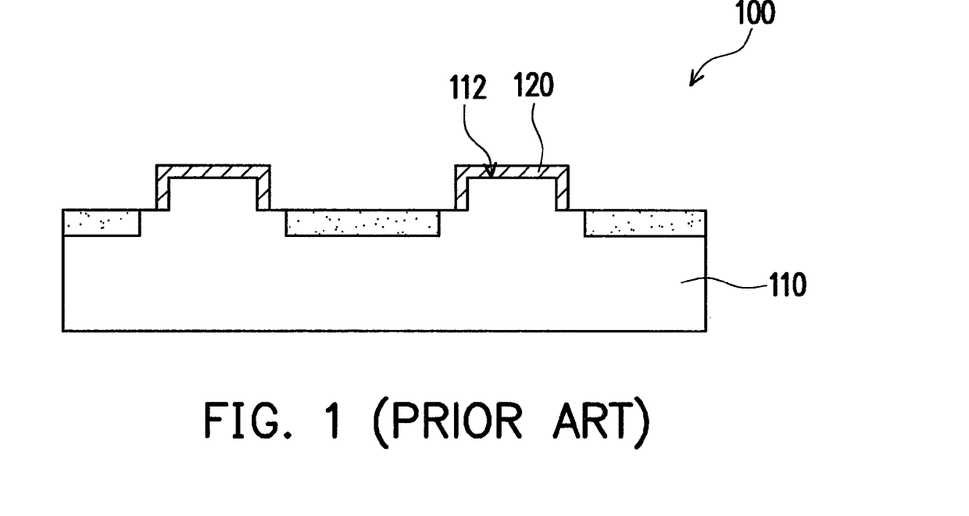
FIG. 1 is a schematic view of a conventional three-dimensional circuit.

FIG. 1 is a schematic cross-sectional view of a conventional three-dimensional circuit. Referring to FIG. 1, a conventional three-dimensional circuit 100 includes a three-dimensional structure 110 and a three-dimensional circuit structure 120 that is disposed on a surface 112 of the three-dimensional structure 110. However, the conventional three-dimensional circuit 100 merely has a single-layer three-dimensional circuit structure 120. Hence, a surface area of the three-dimensional structure 110 must be sufficient enough to accommodate all of the three-dimensional circuit structures 120. Namely, the three-dimensional structure 110 is unlikely to host all of the three-dimensional circuit structures 120, give that the surface area of the three-dimensional structure 110 is rather small.

SUMMARY OF THE INVENTION

The present invention is directed to a manufacturing method of a multilayer three-dimensional circuit. The manufacturing method can be applied to fabricate a three-dimensional circuit with a multilayer three-dimensional circuit structure.

The present invention is further directed to a multilayer three-dimensional circuit structure.

In the present invention, a manufacturing method of a multilayer three-dimensional circuit is described as follows. First, a three-dimensional insulating structure is provided. A first three-dimensional circuit structure is then formed on a surface of the three-dimensional insulating structure. Next, an insulating layer covering the first three-dimensional circuit structure is formed. After that, a second three-dimensional circuit structure is formed on the insulating layer. Subsequently, at least a conductive via penetrating the insulating layer is formed to electrically connect the second three-dimensional circuit structure and the first three-dimensional circuit structure.

In an embodiment of the present invention, a method of forming the three-dimensional insulating structure and the first three-dimensional circuit structure is described as follows. First, an injection molding process or an inkjet rapid prototyping process is performed to form the three-dimensional insulating structure having a three-dimensional surface. Next, a first metallized pattern is hot embossed or electroformed on the three-dimensional surface to form the first three-dimensional circuit structure.

In an embodiment of the present invention, a method of forming the insulating layer and the second three-dimensional circuit structure is described as follows. First, the insulating layer is formed by performing a two-shot molding process, an insert molding process, or an inkjet rapid prototyping process. The insulating layer covers the three-dimensional insulating structure and the first three-dimensional circuit structure. Next, a second metallized pattern is hot embossed or electroformed on the insulating layer to form the second three-dimensional circuit structure.

In an embodiment of the present invention, a method of forming the three-dimensional insulating structure and the first three-dimensional circuit structure is described as follows. First, an injection molding process or an inkjet rapid prototyping process is performed to form the three-dimensional insulating structure having a first three-dimensional surface. A material of the three-dimensional insulating structure includes an insulating material having a plurality of catalyst particles. The catalyst particles are suitable for being activated by laser. Next, a region of the first three-dimensional surface is activated by performing a laser process thereon, wherein the first three-dimensional circuit structure is to be formed on the region of the first three-dimensional surface. A surface metallization process is then performed to form the first three-dimensional circuit structure on the region of the first three-dimensional surface.

In an embodiment of the present invention, the surface metallization process includes a chemical deposition process.

In an embodiment of the present invention, the manufacturing method of the multilayer three-dimensional circuit further includes laminating the insulating layer onto the three-dimensional insulating structure after the insulating layer and the second three-dimensional circuit structure are formed, wherein the insulating layer has a second three-dimensional surface, and a shape of a second three-dimensional surface and a shape of the first three-dimensional surface are similar.

In an embodiment of the present invention, the manufacturing method of the multilayer three-dimensional circuit further includes forming an adhesion layer on the first three-dimensional surface before laminating the insulating layer onto the three-dimensional insulating structure. The adhesion layer covers the first three-dimensional circuit structure.

In an embodiment of the present invention, a method of forming the insulating layer and the second three-dimensional circuit structure is described as follows. First, an injection molding process or an inkjet rapid prototyping process is performed to form the insulating layer having a second three-dimensional surface and a third three-dimensional surface opposite thereto. A material of the insulating layer includes an insulating material having a plurality of catalyst particles. The catalyst particles are suitable for being activated by laser. Next, a region of the third three-dimensional surface is activated by performing a laser process thereon, wherein the second three-dimensional circuit structure is to be formed on the region of the third three-dimensional surface. A surface metallization process is then performed to form the second three-dimensional circuit structure on the region of the third three-dimensional surface.

In an embodiment of the present invention, the surface metallization process includes a chemical deposition process.

In an embodiment of the present invention, a method of forming the three-dimensional insulating structure and the first three-dimensional circuit structure is described as follows. First, an injection molding process or an inkjet rapid prototyping process is performed to form the three-dimensional insulating structure having a three-dimensional surface. Next, a first conductive layer is formed on the three-dimensional surface. A portion of the first conductive layer is then etched to form the first three-dimensional circuit structure.

In an embodiment of the present invention, a method of forming the insulating layer and the second three-dimensional circuit structure is described as follows. First, the three-dimensional surface is coated with an insulating material to form the insulating layer. Next, a second conductive layer is formed on the insulating layer. A portion of the second conductive layer is then etched to form the second three-dimensional circuit structure.

In an embodiment of the present invention, a material of the three-dimensional insulating structure and the insulating layer is an elastic material including engineering plastic, ceramics, or glass.

In an embodiment of the present invention, a material of the engineering plastic is selected from a group consisting of epoxy resin, modified epoxy resin, polyester, acrylate, fluoropolymer, polyphenylene oxide (PPO), polyimide (PI), phenolicresin, polysulfone (PSF), silicone polymer, bismaleimide triazine modified epoxy (BT Resin), cyanate ester, polyethylene (PE), polycarbonate (PC), acrylonitrile-butadiene-styrene (ABS) copolymer, polyethylene terephthalate (PET), polybutylene terephthalate (PBT), liquid crystal polymer (LCP), polyamide 6 (PA 6), nylon, polyoxymethylene (POM), polyphenylene sulfide (PPS), and cyclic olefin copolymer (COC).

In an embodiment of the present invention, the elastic material further includes an insulating material having a plurality of catalyst particles. The catalyst particles are suitable for being activated by laser and are selected from a group consisting of metallic oxide particles, metallic nitride particles, metallic complex particles, metallic chelate particles, and metallic coordination compound particles.

In an embodiment of the present invention, a material of the catalyst particles is selected from a group consisting of manganese (Mn), chromium (Cr), palladium (Pd), copper (Cu), aluminum (Al), zinc (Zn), silver (Ag), gold (Au), nickel (Ni), cobalt (Co), rhodium (Rh), iridium (Ir), iron (Fe), molybdenum (Mo), wolfram (W), vanadium (V), tantalum (Ta), titanium (Ti), indium (In) and platinum (Pt).

The present invention further provides a multilayer three-dimensional circuit structure including a three-dimensional insulating structure, a first three-dimensional circuit structure, an insulating layer, a second three-dimensional circuit structure, and at least a conductive via. The three-dimensional insulating structure has at least a three-dimensional surface. The first three-dimensional circuit structure is disposed on the at least a three-dimensional surface. The insulating layer is disposed on the three-dimensional insulating structure and covers the first three-dimensional circuit structure. The second three-dimensional circuit structure is disposed on the insulating layer. The at least a conductive via penetrates the insulating layer and electrically connects the first three-dimensional circuit structure and the second three-dimensional circuit structure.

In an embodiment of the present invention, the three-dimensional insulating structure is an injection molding structure or an inkjet rapid prototyping structure.

In an embodiment of the present invention, the insulating layer has an injection molding structure, a coating structure, a two-shot molding structure, an insert molding structure, or an inkjet rapid prototyping structure.

In an embodiment of the present invention, the insulating layer has the injection molding structure, and the multilayer three-dimensional circuit structure further includes an adhesion layer that is interposed between the insulating layer and the three-dimensional insulating structure.

In an embodiment of the present invention, a material of the three-dimensional insulating structure and the insulating layer is an elastic material including engineering plastic, ceramics, or glass.

In an embodiment of the present invention, a material of the engineering plastic is selected from a group consisting of epoxy resin, modified epoxy resin, polyester, acrylate, fluoropolymer, PPO, PI, phenolicresin, PSF, silicone polymer, BT Resin, cyanate ester, PE, PC, ABS copolymer, PET, PBT, LCP, PA 6, nylon, POM, PPS, and COC.

In an embodiment of the present invention, the elastic material further includes an insulating material having a plurality of catalyst particles. The catalyst particles are suitable for being activated by laser and are selected from a group consisting of metallic oxide particles, metallic nitride particles, metallic complex particles, metallic chelate particles, and metallic coordination compound particles.

In an embodiment of the present invention, a material of the catalyst particles is selected from a group consisting of manganese, chromium, palladium, copper, aluminum, zinc, silver, gold, nickel, cobalt, rhodium, iridium, iron, molybdenum, wolfram, vanadium, tantalum, titanium, indium, and platinum.

In light of the foregoing, the three-dimensional circuit having the multilayer three-dimensional circuit structure can be formed by applying the manufacturing method of the multilayer three-dimensional circuit in the present invention. Hence, in comparison with the pertinent art, the present invention can make use of the surface of the three-dimensional insulating structure in a more effective manner.

In order to make the above and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 2:
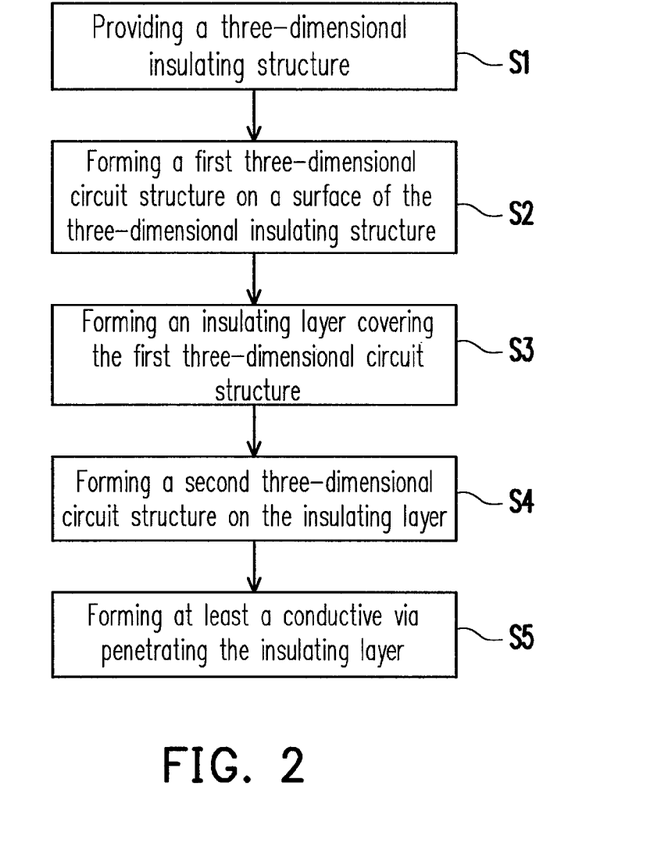
FIG. 2 is a flowchart of fabricating a multilayer three-dimensional circuit according to an embodiment of the present invention.

FIG. 2 is a flowchart of fabricating a multilayer three-dimensional circuit according to an embodiment of the present invention. Referring to FIG. 2, in the present embodiment, a manufacturing method of a multilayer three-dimensional circuit includes following steps. First, in step S1, a three-dimensional insulating structure is provided. The three-dimensional insulating structure is formed by performing an injection molding process or an inkjet rapid prototyping process, for example.

A material of the three-dimensional insulating structure is, for example, an elastic material including engineering plastic, ceramics, or glass. A material of the engineering plastic is selected from a group consisting of epoxy resin, modified epoxy resin, polyester, acrylate, fluoro-polymer, PPO, PI, phenolicresin, PSF, silicone polymer, BT Resin, cyanate ester, PE, PC, ABS copolymer, PET, PBT, LCP, PA 6, nylon, POM, PPS, and COC. The elastic material can selectively be an insulating material having a plurality of catalyst particles. The catalyst particles are suitable for being activated by laser. By implementing a surface metallization process, a metal layer is formed on the catalyst particles that are activated by laser. The catalyst particles are selected from a group consisting of metallic oxide particles, metallic nitride particles, metallic complex particles, metallic chelate particles, and metallic coordination compound particles. In an alternative, a material of the catalyst particles is selected from a group consisting of manganese, chromium, palladium, copper, aluminum, zinc, silver, gold, nickel, cobalt, rhodium, iridium, iron, molybdenum, wolfram, vanadium, tantalum, titanium, indium, and platinum or the combination thereof. For example, the catalyst particles are cupric oxide particles, aluminum nitride particles, Cobalt Molybdenum Bimetallic Nitrides ($Co_2Mo_3N_x$) particles or palladium particles.

Next, in step S2, a first three-dimensional circuit structure is formed on a surface of the three-dimensional insulating structure. Note that the first three-dimensional circuit structure can be formed by performing a hot embossing process or an electroforming process on a surface of the three-dimensional insulating structure, given that the three-dimensional insulating structure is made of a normal elastic material.

When the three-dimensional insulating structure is made of an insulating material having a plurality of catalyst particles, the first three-dimensional circuit structure can be formed by first performing a laser process to activate a portion of the surface of the three-dimensional insulating structure. Next, a surface metallization process is performed on the portion of the surface of the three-dimensional insulating structure.

Afterwards, in step S3, an insulating layer covering the first three-dimensional circuit structure is formed. The insulating layer can be formed by implementing a two-shot molding process, an insert molding process, an injection molding process, a coating process, a spray coating process, an inkjet rapid prototyping process, or any other appropriate process. The inkjet rapid prototyping process is derived from "rapid prototyping" which refers to construction of physical objects using freeform fabrication in combination of computer aided design (CAD) and slicing operation. In particular, models designed by computers are sliced to take horizontal cross sections from the model, and physical models are then fabricated by means of the horizontal cross sections layer by layer. By contrast, when the inkjet rapid prototyping process is performed, physical models are built up by means of three-dimensional (3D) printers. The operating principle of the 3D printers is similar to that of inkjet printers, while the difference therebetween lies in that paper and ink used in the inkjet printers are respectively replaced with powder and adhesive in the 3D printers. The powder and adhesive arranged in a planar form are stacked to form physical three-dimensional objects. Here, the powder is composite powder made of materials including plaster, starch, and/or ABS plastic.

A process of fabricating the insulating layer by implementing the inkjet rapid prototyping process is described below. First, a three-dimensional CAD model of the insulating layer is illustrated by a 3D CAD system, and the illustrated 3D files are then inputted into a 3D printer. Next, a paint roller in the 3D printer transfers the composite powder from a material deposition region to a molding platform, and the composite powder is evenly spread over the molding platform. A molding nozzle then sprays adhesive onto the composite powder in the shape of a cross section of the CAD model. After that, the paint roller and the nozzle are moved back to the material deposition region, and the molding platform lowers one layer. The steps are repetitively performed to bond the cross sections layer by layer (i.e., the so-called "printing" process) until the model of the insulating layer is completely built. Moreover, after the fabrication of the insulating layer, a solidifying solution can be applied on the insulating layer or can be use to soak the insulating layer. The insulating layer is then solidified after 10~15 minutes.

A material of the insulating layer can be an elastic material including engineering plastic, ceramics, or glass. A material of the engineering plastic is selected from a group consisting of epoxy resin, modified epoxy resin, polyester, acrylate, fluoro-polymer, PPO, PI, phenolicresin, PSF, silicone polymer, BT Resin, cyanate ester, PE, PC, ABS copolymer, PET, PBT, LCP, PA 6, nylon, POM, PPS, and COC. The elastic material can selectively be an insulating material having a plurality of catalyst particles. The catalyst particles are suitable for being activated by laser. The catalyst particles are selected from a group consisting of metallic oxide particles, metallic nitride particles, metallic complex particles, metallic chelate particles, and metallic coordination compound particles. In an alternative, a material of the catalyst particles is selected from a group consisting of manganese, chromium, palladium, copper, aluminum, zinc, silver, gold, nickel, cobalt, rhodium, iridium, iron, molybdenum, wolfram, vanadium, tantalum, titanium, indium, and platinum.

After that, in step S4, a second three-dimensional circuit structure is formed on the insulating layer. Similar to the method of forming the first three-dimensional circuit structure, a method of forming the second three-dimensional circuit structure can include performing a hot embossing process or an electroforming process on a surface of the insulating layer when the insulating layer is made of a normal elastic material.

When the insulating layer is made of an insulating material having a plurality of catalyst particles, the second three-dimensional circuit structure can be formed by first performing a laser process to activate a portion of the surface of the insulating layer. Next, a surface metallization process is performed on the portion of the surface of the insulating layer.

Subsequently, in step S5, at least a conductive via penetrating the insulating layer is formed to electrically connect the second three-dimensional circuit structure and the first three-dimensional circuit structure. Note that the conductive via can be formed by performing an electroforming process on an inner wall of a via hole of the insulating layer when the insulating layer is made of a normal elastic material.

When the insulating layer is made of an insulating material having a plurality of catalyst particles, the conductive via can be formed by first performing a laser process to activate the inner wall of the via hole of the insulating layer. Next, a surface metallization process is performed on the inner wall of the via hole of the insulating layer.

It should be mentioned that in steps S1~S5 of the present embodiment, only the two-layer three-dimensional circuit structure is formed. However, according to other embodiments, after step S5 is performed, steps S3~S5 can be repeated over and over, which is determined upon the required layer number of the three-dimensional circuit structure. As such, in other embodiments, the three-dimensional circuit structure can have more than two layers, such as three, four, or more than four. Note that materials and fabricating methods of the elements in each step of the present embodiment can be combined with other materials and fabricating methods of the elements in other steps.

In light of the foregoing, the three-dimensional circuit having the multilayer three-dimensional circuit structure can be formed by applying the manufacturing method of the multilayer three-dimensional circuit in the present embodiment. Hence, in comparison with the pertinent art, the present embodiment can make use of the surface of the three-dimensional insulating structure in a more effective manner.

To better understand the manufacturing method of the multilayer three-dimensional circuit in the present invention, three embodiments are provided hereinafter. However, note that the following three embodiments should not be construed as limitations to the manufacturing method of the multilayer three-dimensional circuit in the present invention.

Figure 3A:
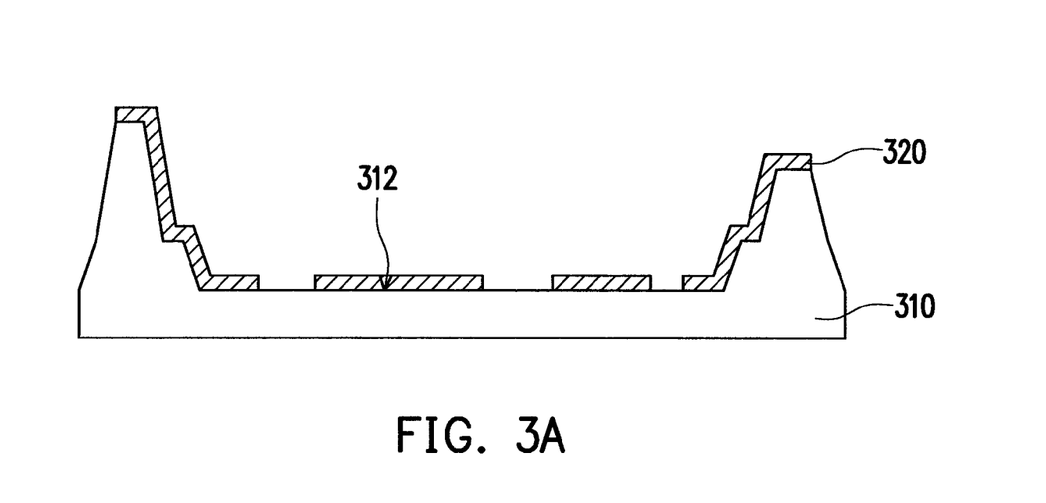
FIGS. 3A to 3B are cross-sectional views illustrating a process of fabricating a multilayer three-dimensional circuit according to an embodiment of the present invention.
Figure 3B:
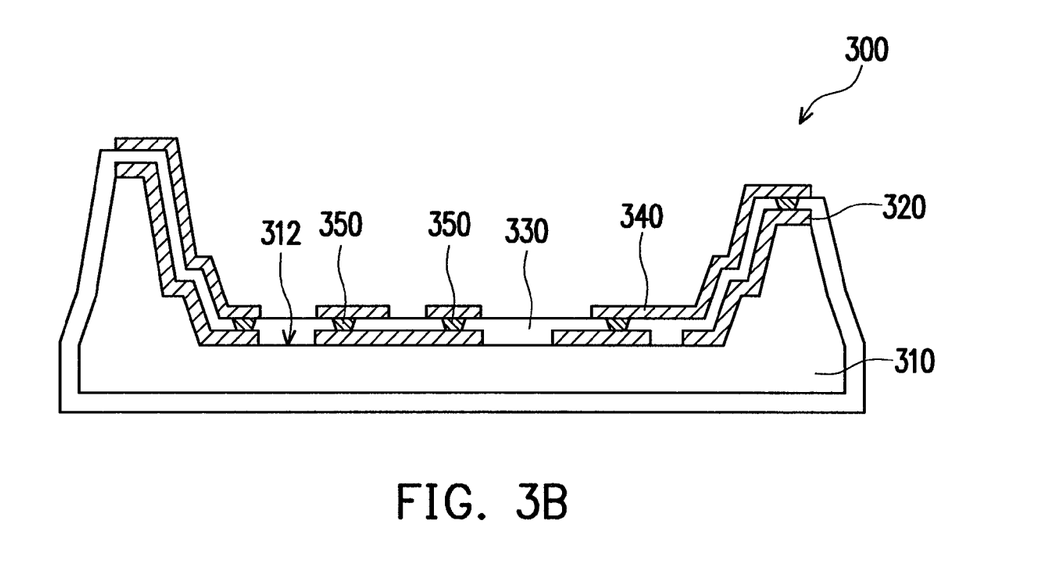

FIGS. 3A to 3B are cross-sectional views illustrating a process of fabricating a multilayer three-dimensional circuit according to an embodiment of the present invention. First, referring to FIG. 3A, an injection molding process or an inkjet rapid prototyping process is performed on a three-dimensional insulating structure 310 having a three-dimensional surface 312. A material of the three-dimensional insulating structure 310 is, for example, an elastic material including engineering plastic, ceramics, or glass. A material of the engineering plastic is selected from a group consisting of epoxy resin, modified epoxy resin, polyester, acrylate, fluoropolymer, PPO, PI, phenolicresin, PSF, silicone polymer, BT Resin, cyanate ester, PE, PC, ABS copolymer, PET, PBT, LCP, PA 6, nylon, POM, PPS, and COC.

In addition, the elastic material can selectively be an insulating material having a plurality of catalyst particles (not shown). The catalyst particles are suitable for being activated by laser. The catalyst particles can be selected from a group consisting of metallic oxide particles, metallic nitride particles, metallic complex particles, metallic chelate particles, and metallic coordination compound particles. In an alternative, a material of the catalyst particles is selected from a group consisting of manganese, chromium, palladium, copper, aluminum, zinc, silver, gold, nickel, cobalt, rhodium, iridium, iron, molybdenum, wolfram, vanadium, tantalum, titanium, indium, and platinum.

Next, a first metallized pattern is hot embossed or electroformed on the three-dimensional surface 312 to form the first three-dimensional circuit structure 320. When a material of the three-dimensional insulating structure 310 includes an insulating material having a plurality of catalyst particles, a method of forming the first three-dimensional circuit structure 320 is described as follows. First, a region of the three-dimensional surface 312 is activated by performing a laser process thereon, wherein the first three-dimensional circuit structure 320 is to be formed on the region of the three-dimensional surface 312. A surface metallization process is then performed on the region of the three-dimensional surface 312 to form the first three-dimensional circuit structure 320.

After that, referring to FIG. 3B, an insulating layer 330 covering the three-dimensional insulating structure 310 and the first three-dimensional circuit structure 320 is formed by implementing a two-shot molding process, a spray coating process, an inkjet rapid prototyping process, or an insert molding process. Thereafter, referring to FIG. 3B, a second metallized pattern is hot embossed or electroformed on the insulating layer 330 to form a second three-dimensional circuit structure 340. Subsequently, a plurality of conductive vias 350 penetrating the insulating layer 330 is formed to electrically connect the second three-dimensional circuit structure 340 and the first three-dimensional circuit structure 320.

The structure of the multilayer three-dimensional circuit depicted in FIG. 3B is detailed hereinafter.

As shown in FIG. 3B, a structure of the multilayer three-dimensional circuit 300 includes a three-dimensional insulating structure 310, a first three-dimensional circuit structure 320, an insulating layer 330, a second three-dimensional circuit structure 340, and a plurality of conductive vias 350.

The three-dimensional insulating structure 310 is, for example, an injection molding structure or an inkjet rapid prototyping structure. Besides, the three-dimensional insulating structure 310 has at least a three-dimensional surface 312, such as an arc-shaped surface, a surface having particles or protrusions, a surface having trenches, or other non-planar surfaces. In the present embodiment, a bonding portion can be formed on a non-planar surface for aligning or securing other bonding components according to demands on tightness between the bonding components and the three-dimensional surface 312. The first three-dimensional circuit structure 320 is disposed on the three-dimensional surface 312. The insulating layer 330 is disposed on the three-dimensional insulating structure 310 and covers the first three-dimensional circuit structure 320. Besides, the insulating layer 330 can have a two-shot molding structure, an inkjet prototyping structure, or an insert molding structure. The second three-dimensional circuit structure 340 is disposed on the insulating layer 330, and the conductive vias 350 penetrate the insulating layer 330 and electrically connect the first three-dimensional circuit structure 320 and the second three-dimensional circuit structure 340.

Figure 4A:
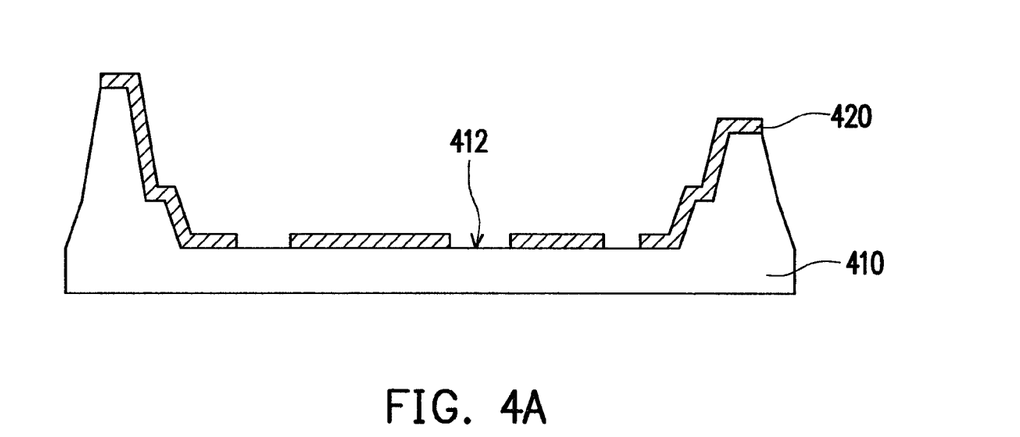
FIGS. 4A to 4C are cross-sectional views illustrating a process of fabricating a multilayer three-dimensional circuit according to another embodiment of the present invention.
Figure 4B:
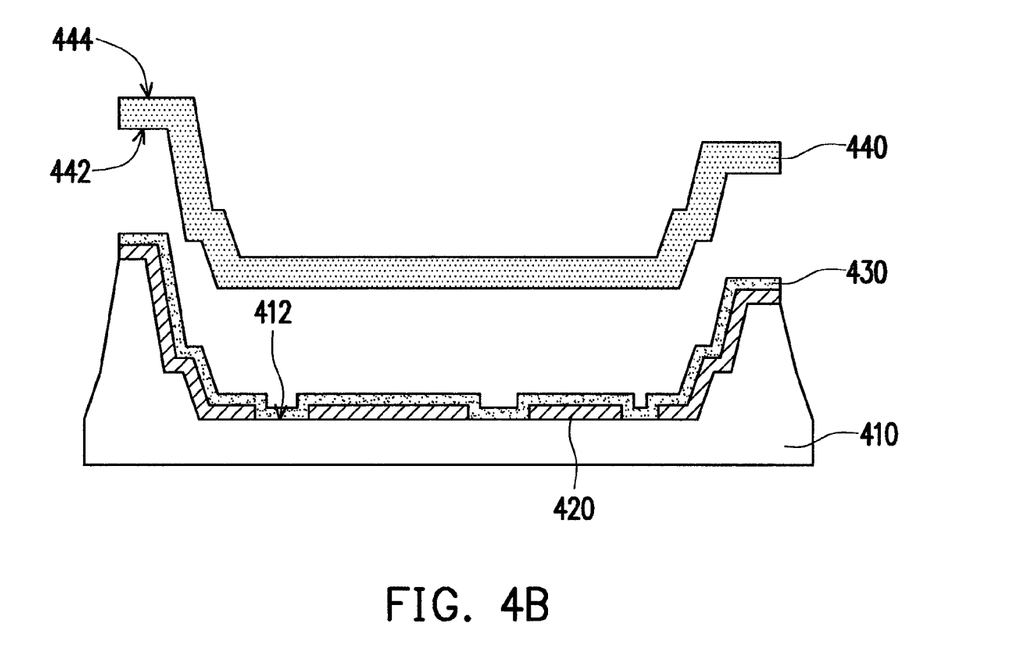
Figure 4C:
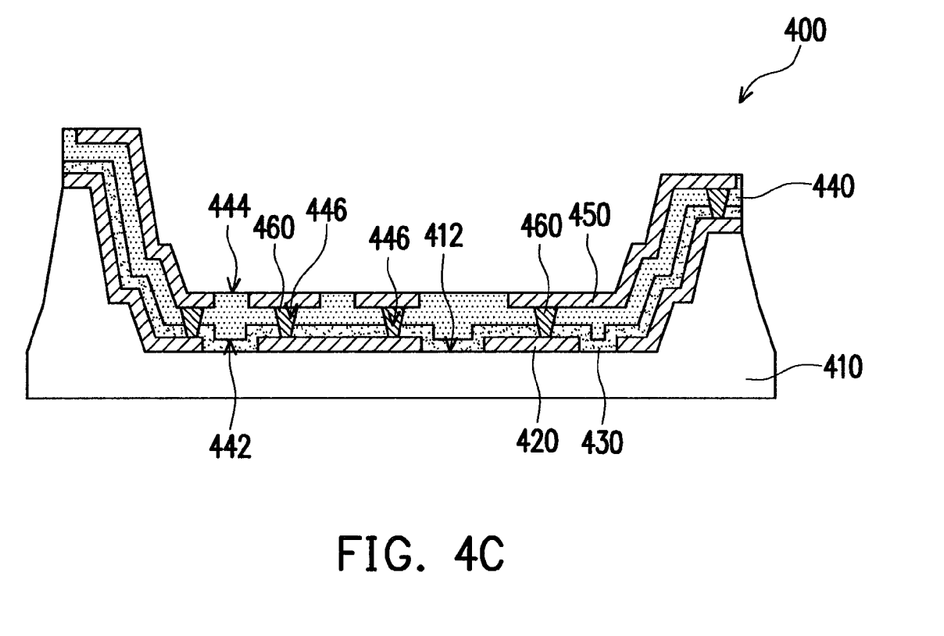

FIGS. 4A to 4C are cross-sectional views illustrating a process of fabricating a multilayer three-dimensional circuit according to another embodiment of the present invention. First, referring to FIG. 4A, an injection molding process or an inkjet rapid prototyping process is performed on a three-dimensional insulating structure 410 having a first three-dimensional surface 412, and a material of the three-dimensional insulating structure 410 includes an insulating material having a plurality of catalyst particles, for example. Next, a region of the first three-dimensional surface 412 is activated by performing a laser process thereon, wherein a first three-dimensional circuit structure 420 is to be formed on the region of the first three-dimensional surface 412. A surface metallization process is then performed on the region of the first three-dimensional surface 412 to form the first three-dimensional circuit structure 420. In the surface metallization process, for example, a chemical deposition process is performed on the region of the first three-dimensional surface 412. Alternatively, a chemical deposition process is performed, and an electroplating deposition process is subsequently carried out.

After that, as shown in FIG. 4B, an adhesion layer 430 is selectively formed on the first three-dimensional surface 412. The adhesion layer 430 covers the first three-dimensional circuit structure 420. An injection molding process or an inkjet rapid prototyping process is then performed to form the insulating layer 440 having a second three-dimensional surface 442 and a third three-dimensional surface 444 opposite thereto. A shape of the second three-dimensional surface 442 and a shape of the first three-dimensional surface 412 are similar. The insulating layer 440 can be made of an insulating material having a plurality of catalyst particles. Additionally, in other embodiments, the insulating layer 440 can also be directly formed by performing a two-shot molding process, an inkjet rapid prototyping process, or an insert molding process without the need of forming the adhesion layer 430.

Thereafter, as shown in FIG. 4C, the insulating layer 440 is laminated onto the adhesion layer 430, such that the insulating layer 440 is secured onto the first three-dimensional surface 412 by means of the adhesion layer 430. Next, a region of the third three-dimensional surface 444 is activated by performing a laser process thereon, wherein a second three-dimensional circuit structure 450 is to be formed on the region of the third three-dimensional surface 444. Subsequently, a plurality of conductive vias 460 penetrating the insulating layer 440 is formed to electrically connect the second three-dimensional circuit structure 450 and the first three-dimensional circuit structure 420.

A method of forming the conductive vias 460 is provided below. First, a plurality of via holes 446 penetrating the insulating layer 440 is formed. Inner walls of the via holes 446 are then activated by implementing a laser process thereon. Next, a surface metallization process is performed on the inner walls of the via holes 446. Besides, the conductive vias 460 can also be formed by performing an electroforming process on the inner walls of the via holes 446.

The structure of the multilayer three-dimensional circuit depicted in FIG. 4C is detailed hereinafter.

As shown in FIG. 4C, a structure of the multilayer three-dimensional circuit 400 includes a three-dimensional insulating structure 410, a first three-dimensional circuit structure 420, an adhesion layer 430, an insulating layer 440, a second three-dimensional circuit structure 450, and a plurality of conductive vias 460.

The three-dimensional insulating structure 410 is, for example, an injection molding structure or an inkjet rapid prototyping structure, for example. Besides, the three-dimensional insulating structure 410 has a first three-dimensional surface 412. The first three-dimensional circuit structure 420 is disposed on the first three-dimensional surface 412. In the present embodiment, the three-dimensional insulating structure 410 can be made of an insulating material having a plurality of catalyst particles. The first three-dimensional circuit structure 420 is a circuit structure formed by performing the surface metallization process on the laser-activated catalyst particles after the catalyst particles are activated by laser.

The insulating layer 440 is disposed on the three-dimensional insulating structure 410 and covers the first three-dimensional circuit structure 420. Besides, the insulating layer 440 can have an injection molding structure or an inkjet rapid prototyping structure. The adhesion layer 430 is interposed between the insulating layer 440 and the three-dimensional insulating structure 410, so as to bond the insulating layer 440 to the three-dimensional insulating structure 410. The second three-dimensional circuit structure 450 is disposed on the insulating layer 440, and the conductive vias 460 penetrate the insulating layer 440 and electrically connect the first three-dimensional circuit structure 420 and the second three-dimensional circuit structure 450.

According to the present embodiment, the insulating layer 440 can be made of an insulating material having a plurality of catalyst particles. The second three-dimensional circuit structure 450 is a circuit structure formed by performing the surface metallization process on the laser-activated catalyst particles after the catalyst particles are activated by laser.

FIGS. 5A to 5D are cross-sectional views illustrating a process of fabricating a multilayer three-dimensional circuit according to still another embodiment of the present invention.

Figure 5A:
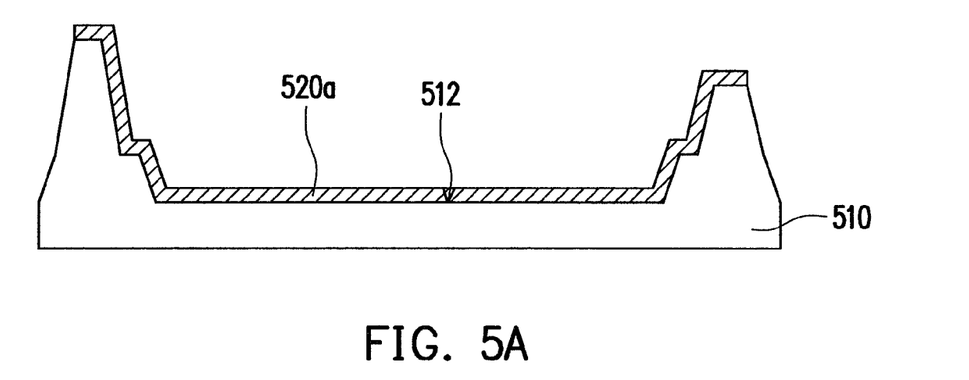
FIGS. 5A to 5D are cross-sectional views illustrating a process of fabricating a multilayer three-dimensional circuit according to still another embodiment of the present invention.

First, referring to FIG. 5A, an injection molding process or an inkjet rapid prototyping process is performed on a three-dimensional insulating structure 510 having a three-dimensional surface 512. Next, a first conductive layer 520a is formed on the three-dimensional surface 512.

Figure 5B:
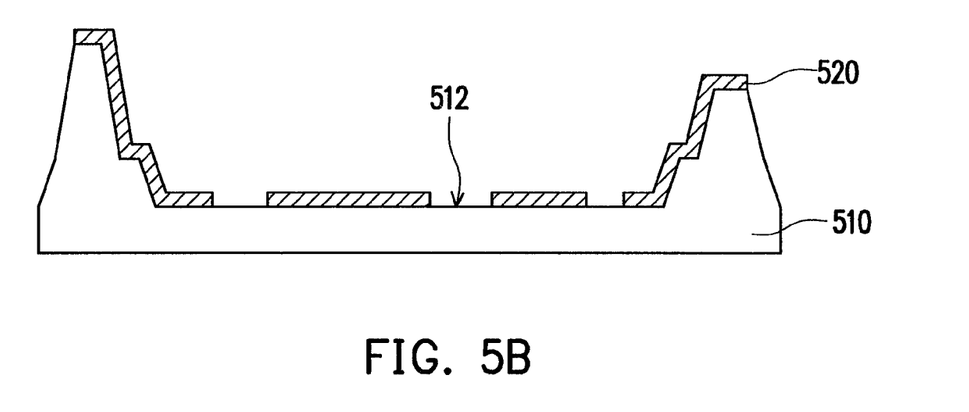
Figure 5C:
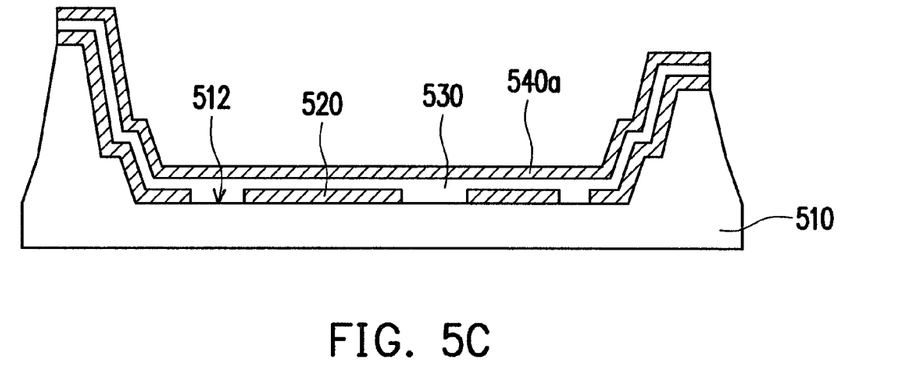

Thereafter, as shown in FIG. 5B, a portion of the first conductive layer 520a is etched to form the first three-dimensional circuit structure 520. Referring to FIG. 5C, the three-dimensional surface 512 is then coated with an insulating material, so as to form an insulating layer 530. Next, a second conductive layer 540a is formed on the insulating layer 530.

Figure 5D:
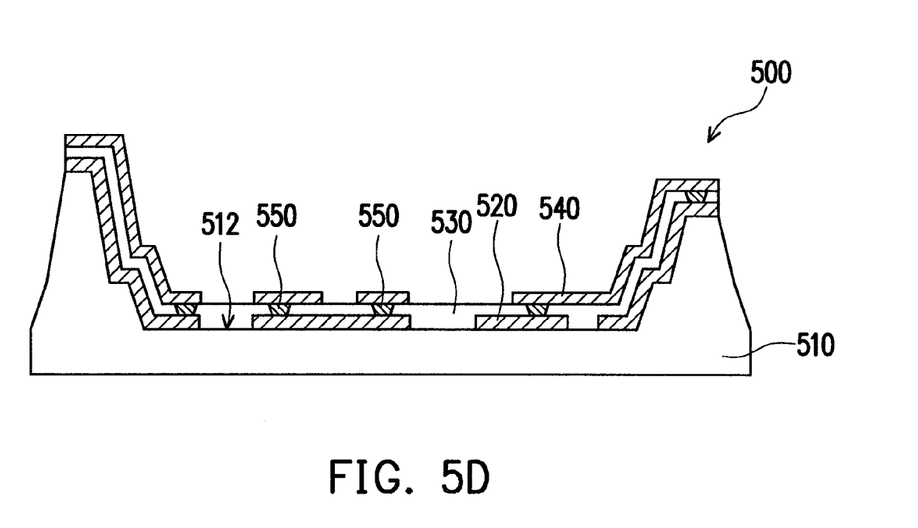

Afterwards, as shown in FIG. 5D, a portion of the second conductive layer 540a is etched to form the second three-dimensional circuit structure 540. Subsequently, a plurality of conductive vias 550 penetrating the insulating layer 530 is formed to electrically connect the second three-dimensional circuit structure 540 and the first three-dimensional circuit structure 520.

Moreover, referring to FIG. 5D, the structure of the multilayer three-dimensional circuit 500 of the present embodiment is similar to the structure of the multilayer three-dimensional circuit 300 depicted in FIG. 3B, whereas the difference therebetween lies in that the insulating layer 530 of the present embodiment has a coating structure.

To sum up, the three-dimensional circuit having the multilayer three-dimensional circuit structure can be formed by applying the manufacturing method of the multilayer three-dimensional circuit in the present invention. Hence, in comparison with the pertinent art, the present invention can make use of the surface of the three-dimensional insulating structure in a more effective manner.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a multilayer three-dimensional circuit, comprising: providing a three-dimensional insulating structure, wherein the three-dimensional insulating structure has a first three-dimensional surface inside a cavity, a bottom portion and at least one bending portion which is connected to and protrudes from the bottom portion; forming a first three-dimensional circuit structure on the first three-dimensional surface of the three-dimensional insulating structure; forming an insulating layer with a second three-dimensional surface in a solid state, wherein a shape of the second three-dimensional surface is similar to a shape of the first three-dimensional surface; placing the insulating layer in the solid state covering the first three-dimensional circuit structure, wherein the second three-dimensional surface contacts to the first three-dimensional surface, forming a second three-dimensional circuit structure on a third three-dimensional surface of the insulating layer opposite to the second three-dimensional surface the bottom portion and the at least one bending portion; and forming at least a conductive via penetrating the insulating layer to electrically connect the second three-dimensional circuit structure and the first three-dimensional circuit structure; performing an injection molding process or an inkjet rapid prototyping process to form the insulating layer a material of the insulating layer comprising an insulating material having a plurality of catalyst particles; activating a region of the third three-dimensional surface by performing a laser process, wherein the second three-dimensional circuit structure is to be formed on the region of the third three-dimensional surface; and performing a surface metallization process to form the second three-dimensional circuit structure on the region of the third three-dimensional surface.

2. The manufacturing method of the multilayer three-dimensional circuit as claimed in claim 1, wherein a method of forming the three-dimensional insulating structure and the first three-dimensional circuit structure comprises:

performing an injection molding process or an inkjet rapid prototyping process to form the three-dimensional insulating structure having a three-dimensional surface; and hot embossing or electroforming a first metallized pattern on the three-dimensional surface to form the first three-dimensional circuit structure.

3. The manufacturing method of the multilayer three-dimensional circuit as claimed in claim 1, wherein a method of forming the insulating layer and the second three-dimensional circuit structure comprises:

forming the insulating layer by performing a two-shot molding process, a spray coating process, an inkjet rapid prototyping process, or an insert molding process, the insulating layer covering the three-dimensional insulating structure and the first three-dimensional circuit structure; and hot embossing or electroforming a second metallized pattern on the insulating layer to form the second three-dimensional circuit structure.

4. The manufacturing method of the multilayer three-dimensional circuit as claimed in claim 1, wherein the surface metallization process comprises a chemical deposition process.

5. The manufacturing method of the multilayer three-dimensional circuit as claimed in claim 1, further comprising forming an adhesion layer on the first three-dimensional surface before laminating the insulating layer onto the three-dimensional insulating structure, the adhesion layer covering the first three-dimensional circuit structure.

6. The manufacturing method of the multilayer three-dimensional circuit as claimed in claim 1, wherein the surface metallization process comprises a chemical deposition process.

7. The manufacturing method of the multilayer three-dimensional circuit as claimed in claim 1, wherein a method of forming the three-dimensional insulating structure and the first three-dimensional circuit structure comprises:

performing an injection molding process or an inkjet rapid prototyping process to form the three-dimensional insulating structure having a three-dimensional surface;

forming a first conductive layer on the three-dimensional surface; and etching a portion of the first conductive layer to form the first three-dimensional circuit structure.

8. The manufacturing method of the multilayer three-dimensional circuit as claimed in claim 1, wherein a material of the three-dimensional insulating structure and the insulating layer is an elastic material comprising engineering plastic, ceramics, or glass.

9. The manufacturing method of the multilayer three-dimensional circuit as claimed in claim 1, wherein the insulating layer has a margin surface which is not covered by the at least one bending portion.

10. The manufacturing method of the multilayer three-dimensional circuit as claimed in claim 7, wherein a method of forming the insulating layer and the second three-dimensional circuit structure comprises:

coating the three-dimensional surface with an insulating material to form the insulating layer;

forming a second conductive layer on the insulating layer; and etching a portion of the second conductive layer to form the second three-dimensional circuit structure.

11. The manufacturing method of the multilayer three-dimensional circuit as claimed in claim 8, wherein a material of the engineering plastic is selected from a group consisting of epoxy resin, modified epoxy resin, polyester, acrylate, fluoro-polymer, polyphenylene oxide, polyimide, phenoli-cresin, polysulfone, silicone polymer, bismaleimide triazine modified epoxy, cyanate ester, polyethylene, polycarbonate, acrylonitrile-butadiene-styrene copolymer, polyethylene terephthalate, polybutylene terephthalate, liquid crystal polymer, polyamide 6, nylon, polyoxymethylene, polyphenylene sulfide, and cyclic olefin copolymer.

12. The manufacturing method of the multilayer three-dimensional circuit as claimed in claim 8, wherein the elastic material further comprises an insulating material having a plurality of catalyst particles.

13. The manufacturing method of the multilayer three-dimensional circuit as claimed in claim 12, wherein the plurality of catalyst particles is selected from a group consisting of metallic oxide particles, metallic nitride particles, metallic complex particles, metallic chelate particles, and metallic coordination compound particles.

14. The manufacturing method of the multilayer three-dimensional circuit as claimed in claim 12, wherein a material of the plurality of catalyst particles is selected from a group consisting of manganese, chromium, palladium, copper, aluminum, zinc, silver, gold, nickel, cobalt, rhodium, iridium, iron, molybdenum, wolfram, vanadium, tantalum, titanium, indium, and platinum.

15. A manufacturing method of a multilayer three-dimensional circuit, comprising:

performing an injection molding process or an inkjet rapid prototyping process to form the three-dimensional insulating structure having a first three-dimensional surface, a bottom portion and at least one bending portion which is connected to and protrudes from the bottom portion, wherein a material of the three-dimensional insulating structure comprising an insulating material having a plurality of catalyst particles;

activating a region of the first three-dimensional surface to expose the catalyst particles by performing a laser process thereon, wherein a first three-dimensional circuit structure is to be formed on the region of the first three-dimensional surface;

performing a surface metallization process to form the first three-dimensional circuit structure on the region of the first three-dimensional surface;

forming an insulating layer with a second three-dimensional surface in a solid state, wherein a shape of the second three-dimensional surface is similar to a shape of the first three-dimensional surface;

placing the insulating layer in the solid state covering the first three-dimensional circuit structure, wherein the second three-dimensional surface contacts to the first three-dimensional surface, and a shape of the second three-dimensional surface is similar to a shape of the first three-dimensional surface;

forming a second three-dimensional circuit structure on the insulating layer; and forming at least a conductive via penetrating the insulating layer to electrically connect the second three-dimensional circuit structure and the first three-dimensional circuit structure.

16. The manufacturing method of the multilayer three-dimensional circuit as claimed in claim 15, wherein the plurality of catalyst particles is selected from a group consisting of metallic oxide particles, metallic nitride particles, metallic complex particles, metallic chelate particles, and metallic coordination compound particles.

17. The manufacturing method of the multilayer three-dimensional circuit as claimed in claim 15, wherein a material of the plurality of catalyst particles is selected from a group consisting of manganese, chromium, palladium, copper, aluminum, zinc, silver, gold, nickel, cobalt, rhodium, iridium, iron, molybdenum, wolfram, vanadium, tantalum, titanium, indium, and platinum.

18. The manufacturing method of the multilayer three-dimensional circuit as claimed in claim 15, wherein the surface metallization process comprises a chemical deposition process.

19. The manufacturing method of the multilayer three-dimensional circuit as claimed in claim 15, wherein the insulating layer has a margin surface which is not covered by the at least one bending portion.

* * * * *